United States Patent

Marshall et al.

[11] Patent Number: 5,832,493
[45] Date of Patent: Nov. 3, 1998

[54] FLASH FILE MANAGEMENT SYSTEM

[75] Inventors: Jonathan Miles Marshall; Charles David Hope Manning, both of Christchurch, New Zealand

[73] Assignee: Trimble Navigation Limited, Sunnyvale, Calif.

[21] Appl. No.: 847,459

[22] Filed: Apr. 24, 1997

[51] Int. Cl.$^6$ .................................................. G06F 17/30
[52] U.S. Cl. ........................ 707/101; 707/206; 364/400
[58] Field of Search ................................... 707/101, 206; 364/400

[56] References Cited

U.S. PATENT DOCUMENTS

| | | | |
|---|---|---|---|
| 5,528,248 | 6/1996 | Steiner et al. | 364/400 |
| 5,592,669 | 1/1997 | Robinson et al. | 707/206 |
| 5,598,370 | 1/1997 | Niijima et al. | 707/101 |
| 5,634,050 | 5/1997 | Krueger et al. | 707/101 |
| 5,701,492 | 12/1997 | Wadesworth et al. | 707/101 |
| 5,731,978 | 3/1998 | Tamai et al. | 364/400 |

*Primary Examiner*—Wayne Amsbury
*Assistant Examiner*—Thu-Thao Havan
*Attorney, Agent, or Firm*—David R. Gildea

[57] ABSTRACT

A flash memory using branded sectors for managing data files. The flash memory is divided into separately erasable blocks where each block may only be erased in its entirety. Each erasable block includes several file sectors, a sector allocation table (SAT) including an SAT record for each file sector, and a block information record (BIR) including status and an erasure count for the block. Each file sector may be designated as a file data sector, a file header sector, or block erasure sector. The data sectors include a data segment of one of the data files and is branded by a file identification and a sequence number. The brand and the size of the file sectors are used for locating the data sector for accessing the data segment. In order to prevent data from being lost during an update or a consolidation, each SAT record includes a pre-discard indicator for indicating when the associated data sector is being modified or consolidated and a discard indicator for indicating that the modification or consolidation has been completed. In order to prevent block information from being lost during an erasure, the block erasure sector includes the status and erasure counts for each of the erasure blocks.

14 Claims, 5 Drawing Sheets

SECTOR ALLOCATION TABLE (SAT) RECORD

| BITS | DESCRIPTION |
|------|-------------|
| 1111 | FREE |
| 110X | CURRENT |
| XX01 | ALLOCATED AS A FILE DATA SECTOR |
| XX00 | ALLOCATED AS A FILE INFORMATION SECTOR |
| 010X | PRE-DISCARDED |
| 000X | DISCARDED |

FIG. 5

FLASH FILE MANAGEMENT SYSTEM

BACKGROUND OF THE INVENTION

1. Field of the Invention

The invention relates generally to systems for storing data and more particularly to a method and apparatus for storing data files with a flash memory.

2. Description of the Prior Art

A flash memory is a non-volatile electronic memory that can be used for storing data that is written and read by a computer. Flash memory has a similar function to magnetic floppy disk memory, magnetic hard disk memory, re-writeable optical disk memory, and electrically programmable read only memory (EPROM) in that the data that it stores is not lost when power is switched off. However, flash memory has the advantages over the disk memories of being faster, more mechanically robust, and not needing an expensive drive. And, unlike EPROM, flash memory has the capability of being erased electronically. Static random access memory (SRAM) is sometimes considered to be non-volatile because the SRAM is commonly packaged together with a long-life backup battery. Historically, SRAM has been preferable over flash memory because SRAM has been less expensive. However, flash memory has been decreasing in cost at a more rapid rate than SRAM and is now or is projected to be less expensive than SRAM. Further, flash memory is less susceptible to losing data due to power glitches and radiation and does not require a battery to preserve its contents.

Unfortunately, flash memory has several properties that complicate the implementation of a flash memory system. Unlike SRAM, flash memory chips are electronically organized into relatively large erasure blocks, 64 K being a typical erasure block size, that can only be erased in their entirety. Changing a data bit in a flash memory location from an erased state ("1") to a marked state ("0") is relatively easy and fast but changing a bit from the marked state to the erased state is relatively difficult and time consuming because the entire erasure block that includes the bit must be erased. Further, flash memory wears out and becomes unreliable after a relatively small number of erasures, typically in the range of ten thousand to one million. Therefore, standard data management systems that require writing either a "1" or a "0" into any data bit at any time are inappropriate for a flash memory.

Existing flash memory systems store data in virtual sectors within each erasure block. When a data bit in a sector must be changed from a marked state to an erased state, rather than erasing the entire erasure block that includes the sector and then re-writing the entire erasure block, the flash memory system re-writes the data in the sector into another sector that is already erased or free. This system requires the flash memory to be slightly larger in order to guarantee that there is always a free sector but reduces the number of times that each block must be erased and reduces the rewrite time. Such system must include a method for tracking the location of the sectors of data.

Traditionally, memory management systems use a linked list of sectors to store a file or data set, with a pointer attached to each sector for directing the system to the next sector of data. Such systems increase wear in a flash memory because any time that a data bit is changed from a marked state to an erased state, the entire sector that includes the data bit, the pointer to that sector, the pointer to the pointer, and so on must be must be erased and re-written. One solution to this problem has been to attach a second pointer to each sector to point to the more recent copy of the sector. This method effectively links the re-written sectors but does not free the original sector memory space for re-use and increases the time required to find a particular segment of the data in the file. To recover the lost space and to improve access time, a complex algorithm is employed to re-copy the file into new sectors. However, the re-copying can be time-consuming and data may be lost due to noise or if power fails at any time during the process.

Ban in U.S. Pat. No. 5,404,485 discloses a system for using a flash memory to emulate a random access storage media such as a disk. However, the system in Ban requires more frequent erasures of the erasure blocks than is desirable and has the possibility that data may be lost due to noise or a power failure while an erasure block is being re-copied.

There is a need for a flash memory system for storing data files that prevents data from being lost due to a power failure or noise when the data is being updated or an erasure block is being re-copied and minimizes the frequency of erasures in order to minimize wear.

SUMMARY OF THE INVENTION

It is therefore an object of the present invention to provide an improved file storage method and data structure apparatus that reduces the frequency that erasures are required for managing data files.

Another object is to reduce the likelihood that data will be lost due to a power failure or noise that occurs while the data is being updated or consolidated.

Briefly, in a preferred embodiment of the present invention each erasure block of a flash memory is divided into a number of sectors. The first sector in each erasure block contains a block information record (BIR) having information about the block and a sector allocation table (SAT) having information about the remaining sectors (file sectors) in the block.

The BIR includes an erasure count for the erasure block and status information indicating whether the block is ready for erasure, the information in the block is valid, or the block is worn out and has been retired.

The SAT includes a SAT record for each of the file sectors indicating whether the corresponding file sector has been allocated as a data sector or a header sector and whether the sector is free for use, is currently being used, has been pre-discarded, or has been discarded. Each data sector includes a segment of a data file, a file identification, and a sequence number for enabling a segment of data from the file to be accessed without the use of sector-to-sector pointers.

To update or copy the data segment in a data sector or file information in a header sector, the SAT record for the sector is marked as pre-discarded, the updated or existing data or information is copied into a new sector marked as free, the new sector is allocated and marked as current, and the old sector is then marked as discarded. This method insures that the existing data and information is not lost while it is being updated or copied even if a power failure or large noise spike occurs during that time.

To prevent the erasure block information being lost while being re-copied, one of the file header sectors is identified within the sector as a block erasure sector. The block erasure sector includes a block number for each erasure block and duplicates the information for that block's erasure count and status.

The present invention using only flash memory as summarized above is functional. However, the speed for access data is improved by using a run time management system including a file table, file descriptors, an inode tree, and a cache for designating one of the valid erasure blocks as the writing block and a data sector within the writing block as the writing sector.

An advantage of the improved file storage method and apparatus of the present invention is that the frequency of erasures is reduced thereby decreasing wear and overhead time.

Another advantage is that data is less likely to be lost when a power failure or noise that occurs while the data is being updated or an erasure block is being consolidated.

These and other objects and advantages of the present invention will no doubt become obvious to those of ordinary skill in the art after having read the following detailed description of the preferred embodiments which are illustrated in the various figures.

IN THE DRAWINGS

FIG. 5 is a chart of a sector allocation table for the memory of FIG. 1.

DETAILED DESCRIPTION OF THE PREFERRED EMBODIMENTS

Figure 1:
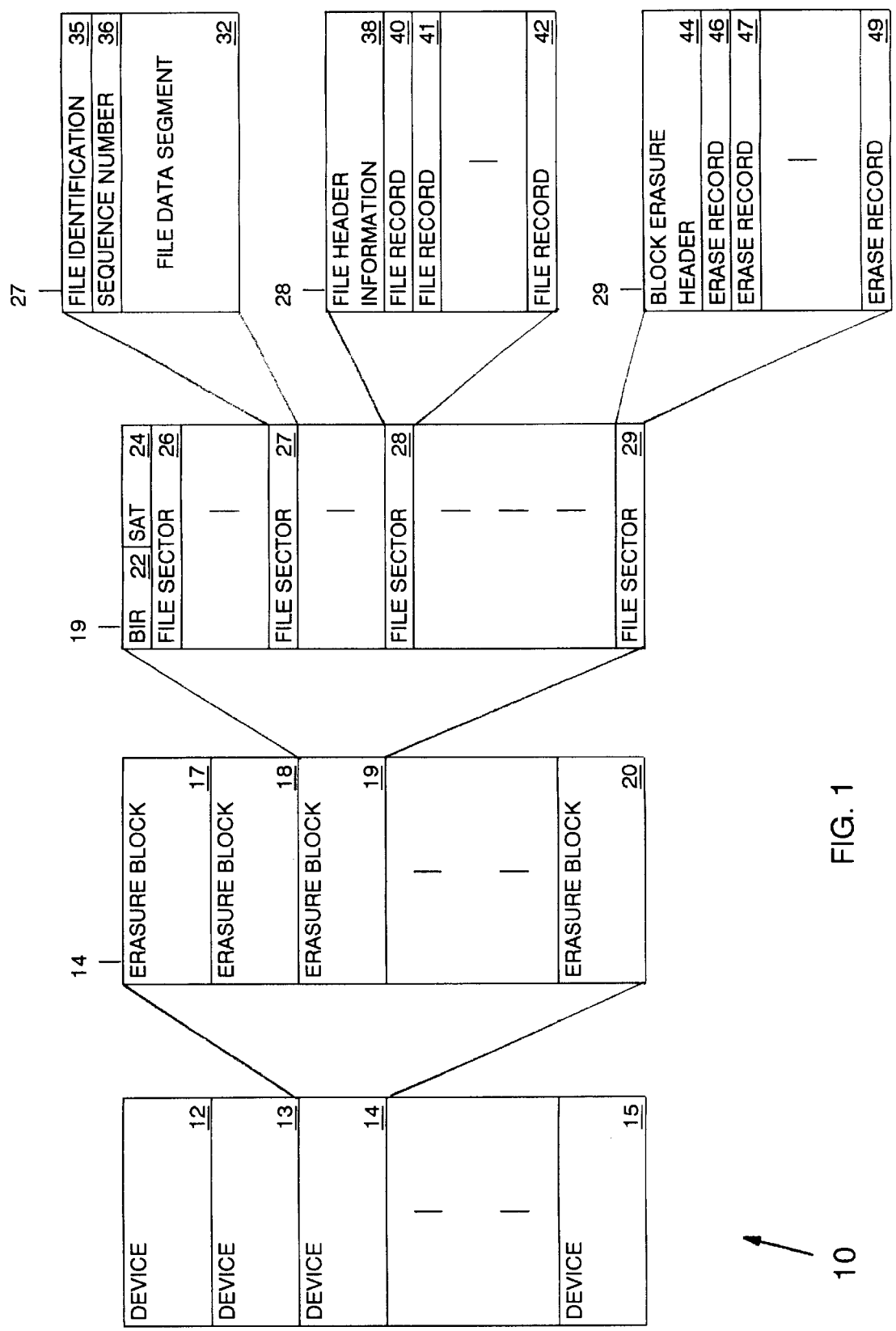
FIG. 1 is a block diagram of a data structure for a flash memory of the present invention.

FIG. 1 is a block diagram of a flash memory the present invention referred to herein by the general reference number 10. The flash memory 10 is programmed with the data structure of the present invention and includes one or more integrated circuit flash memory chips shown as devices 12, 13, 14, and 15. Each of the devices 12–15 includes a range of physical addresses where each physical address corresponds to an individual data byte having eight bits. When two or more devices 12–15 are used, the ranges of physical addresses are distinguished with chip enable signals. The physical address range in each of the devices is divided into one or more separately erasable erasure blocks shown as erasure blocks 17, 18, 19, and 20. In order to simplify FIG. 1 and the following description, the erasable blocks 17–20 are shown only for the device 14. Each of the erasable blocks 17–20 is erasable only in its entirety. By convention, the erased state of a data bit in the flash memory 10 is designated as "1" and a marked state is designated as a "0". The bits of information in the flash memory 10 initially have an erased state and are changed to a marked state when an action occurs, thereby minimizing the number of times that the memory 10 must be erased. Although the preferred embodiment is described in terms of the type of memory commonly known as "flash" it is to be understood that the present invention may be applied to other types of memory, especially, types of memory where bits are individually marked but erasures are required or desired to be done by blocks.

Each of the erasure blocks 17–20 is formatted to include a first sector including a block information record (BIR) 22 and a sector allocation table (SAT) 24, and two-hundred fifty-five file sectors shown as file sectors 26, 27, 28, and 29. In order to simplify FIG. 1 and the following description, the file sectors 26–29 are shown only for the erasure block 19. The BIR 22 includes an erasure count for indicating the wear on the erasure block 19, a version number, and a validity indicator. The erasure count is a thirty-two bit unsigned number that starts at FFFFFFFF and decrements toward zero each time the erasure block 19 is erased. The version number is a thirty-two bit unsigned number for the version of the data structure programmed into the memory 10. The validity indicator is a thirty-two bit unsigned number indicating that the erasure block 19 is ready for erasure, is retired due to a failed erasure, or is valid as shown in table 1 below.

TABLE 1

| Value | Meaning |
|---|---|
| 0xFFFFFFFF | Erased. The erasure block can be in this condition when the flash memory is unformatted or when the block has been erased but the validity indicator and the erasure count have not yet been updated. If the erasure block is in this state, but the rest of the block is not blank, then the erasure block should be re-erased. |
| 0xFFFF0000 | This value is written to the block when it has been made ready for erasure. |
| 0x00000000 | The erasure block is retired due to a failed erasure. |
| 0xFFFF1234 | The erasure block is valid and the erasure count is correct. |

The SAT 24 includes a SAT record 25 (FIG. 5) for each of the files sectors 26–29 where the SAT record 25 having the first physical address within the SAT 24 refers to the file sector 26–29 having the first physical address range within the erasure block 19, the SAT record that has the second physical address within the SAT 24 refers to the file sector 26–29 having the second physical address within the erasure block 19, and so on. As illustrated in FIG. 5 each SAT record 25 includes four bits for indicating that the corresponding file sectors 26–29 are free, active (current), pre-discarded, or discarded; and allocates the file sectors 26–29 for storing file data or file header information. Any number of the two-hundred fifty-five file sectors 26–29 may be designated for either file data of file header information, however, in order to simplify FIG. 1 and the following description the file sector 27 is designated as file data sector 27 and the file sector 28 is designated as file header sector 28.

The file data sector 27 includes a file data segment 32 for a segment of a data file, a file identification 35 for identifying the data file, and a sequence number 36 for the sequential position of the data segment 32 within the data file, thereby eliminating the requirement for each file data sector 27 to have a pointer to the next data sector. In a preferred embodiment, the file identification 35 and the sequence number are each sixteen bit unsigned numbers and the file data segment 32 includes two-hundred fifty-two bytes.

The file header sector 28 includes file header information 38 and up to fourteen file records illustrated as file records 40, 41, and 42. The file header information 38 includes a sixteen bit unsigned number for the file identification, two bytes of "FFFF", and thirteen bytes for a twelve character plus terminator file name corresponding to the file identification. Each file records 40–42 includes a thirty-two bit unsigned number for a checksum for the file, a thirty-two bit unsigned number for the length of the file, a thirty-two bit unsigned number for the date of the last update or append to the file, and a thirty-two bit unsigned number for the time of the last update or append to the file. Each time the file is updated or appended the address space of the position of the next file record 40–42 is marked up to fourteen file records 40–42. When all fourteen address spaces have been used, a new file header sector is selected from the file sectors 26–29 that are free and marked with the file information.

A third type of the file sectors 26–29 is a block erasure sector referred to in FIG. 1 with the reference numeral 29. The block erasure sector 29 provides information for identifying erasure blocks 17–20 that were being erased when the erasure was unexpectedly terminated and insures that the erasure count for each of the erasure blocks 17–20 will not be lost due to a power failure during erasure. The block erasure sector 29 includes block erasure header 44 having thirty-two bits of "FFFFFFFF" followed by eight bits of "00" and erase records 46–49. Each erase record 46–49 includes eight bits for the state of the erasure block 17–20, followed by the block number of the corresponding erasure block 17–20, followed by the erasure count of that erasure block 17–20. The state is indicated by "FF" for unused, "FE" for active, and "00" for discarded. When the erasure block 17–20 is being consolidated, only the erase records 46–49 that are active need to be copied.

Figure 2:
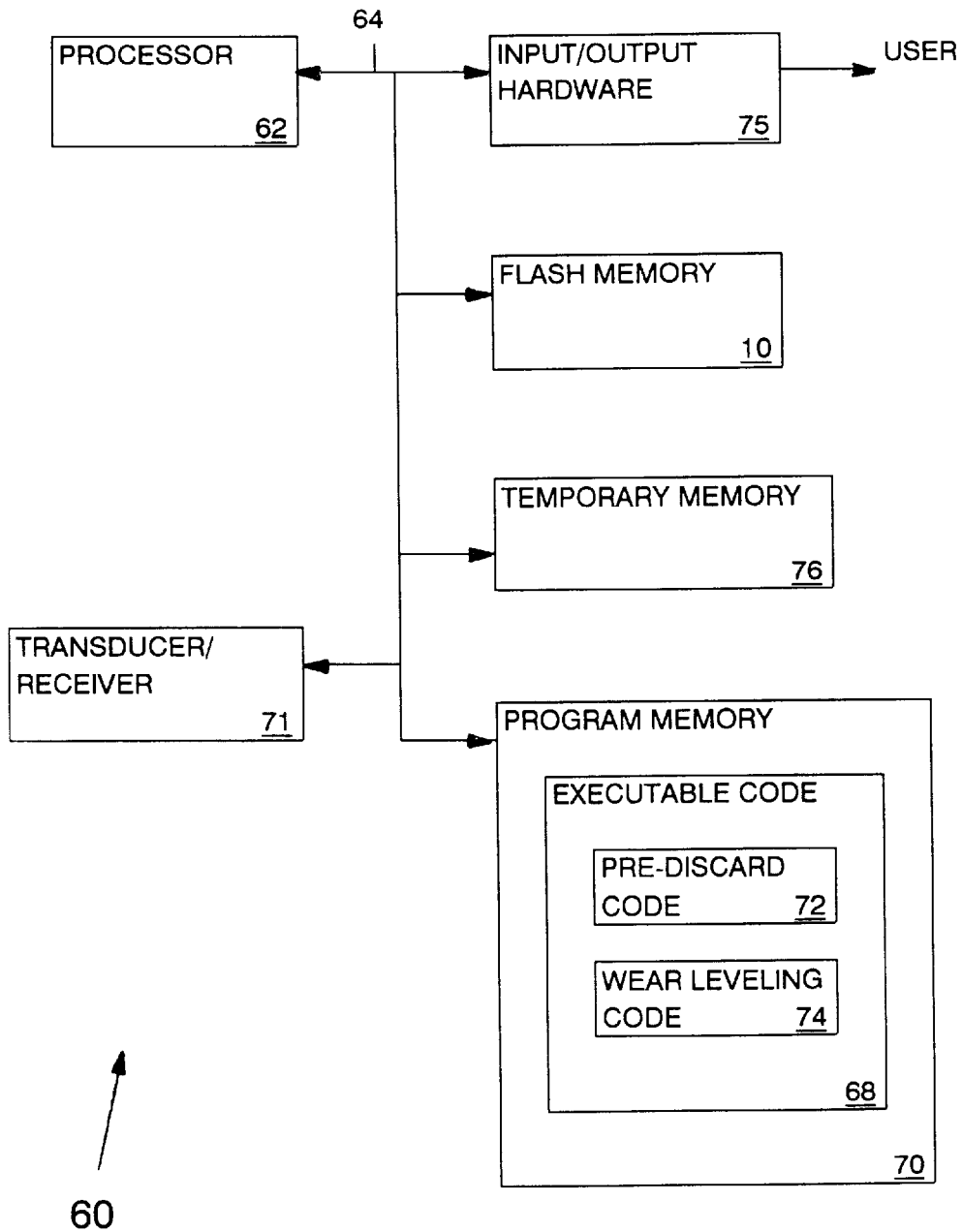
FIG. 2 is a block diagram of a computing machine of the present invention using the flash memory of FIG. 1.

FIG. 2 illustrates a block diagram of a computing machine of the present invention referred to herein by the general reference number 60. The computing machine 60 includes a digital computer processor 62 operating on a digital bus 64 for accessing the flash memory 10 according to instructions in an executable code 68 stored in a program memory 70. In a preferred embodiment the program memory 70 is constructed with flash memory or electronically programmable read only memory (EPROM). optionally, the computing machine 60 includes a transducer/receiver 71 such as a global positioning system (GPS) receiver for gathering the data that is to be stored in the flash memory 10. The executable code 68 includes instructions for using the data structure of the flash memory 10 for accessing the data files stored in the flash memory 10 and for controlling the computing machine 60.

The executable code 68 includes a pre-discard code 72 for marking the pre-discard and discard indicators in the Table 1 for minimizing the likelihood of losing data due to a power outage; and a wear leveling code 74 for using the erasure counts in the BIR 22 (FIG. 1) for minimizing the wear on the erasure blocks 17–20. If nothing is done about it, the situation could easily arise where file sectors 26–29 that are active are sparsely spread through the flash memory 10 because the erasure blocks 17–20 contain many file sectors 26–29 that are discarded. In order to reclaim the discarded address space, the flash memory 10 must be consolidated by copying the active file sectors 26–29 from one or more of the erasure blocks 17–20 into one of the erasure blocks 17–20 that is free or active.

The wear leveling code 74 includes instructions for selecting the erasure block 17–20 for reuse as follows: 1) selecting the erasure blocks 17–20 in which all the file sectors 26–29 have been allocated; 2) from the erasure blocks 26–29 that are completely allocated, selecting the erasure blocks 17–20 with the lowest number of file sectors 26–29 that are active; and 3) if two of the erasure blocks 17–20 that are completely allocated have the same number of file sectors 26–29 that are active, selecting the erasure blocks 26–29 with the lowest erasure count.

In order to consolidate the file sectors 26–29 or to modify the data segment 32, the file sectors 26–29 are copied by the executable code 68 into new address space. The pre-discard code 72 includes instructions for marking the pre-discarded indicator (FIG. 5) corresponding to the file sector 26–29 before that file sector 26–29 is copied into a new address space and marking the discarded indicator corresponding to the file sector 26–29 after the copy is complete. The use of the pre-discarded indicator ensure that the data and information in the existing file sectors 26–29 is not lost while it is being updated, modified, or consolidated even if a power failure or large noise spike occurs during that time.

Input/output hardware 75 enables the processor 62 to receive and issue data and information for the data files to a human or computer user. A temporary memory 76 includes an image of the data structure of the flash memory 10 for improving the speed with which data segment 32 in the data files can be accessed. In a preferred embodiment the temporary memory 76 is static random access memory (SRAM).

The computing machine 60 is capable of writing, reading, and modifying data files in the flash memory 10 without the use of the temporary memory 76 since all of the required information for accessing the data files is stored in the flash memory 10. However, the use of the temporary memory 76 can dramatically improve the speed with which the processor 62 can locate the data in a particular data file in the flash memory 10. Various implementations of data structures are possible for the temporary memory 76 and can be adapted to the size of the temporary memory 76 that is available. In a preferred embodiment the executable code 68 includes instructions for a run time management system 80 (FIG. 3) operating with the temporary memory 76 as described below.

Figure 3:
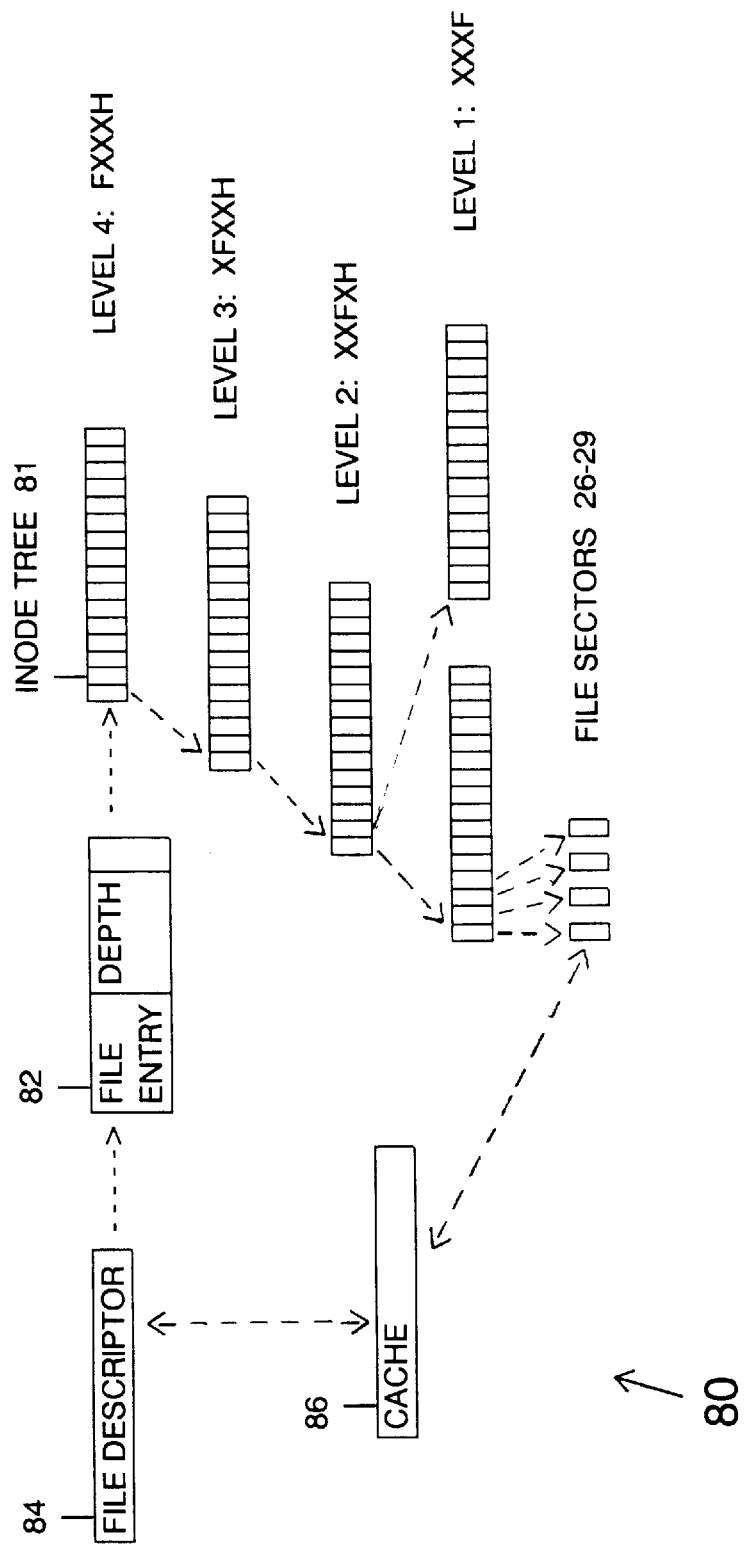
FIG. 3 is a diagram of a run time management system of the computing machine of FIG. 2.

FIG. 3 is a diagram of the run time management system 80 of a preferred embodiment of the present invention. The run time management system 80 using instructions in the executable code 68 for storing variables in the temporary memory 76. The run time management system includes an inode tree 81 having inodes having sixteen slots each. The slots refer to different items depending on the depth of an inode tree. Slots in level 1 inodes refer to the file sectors 26–29. Level 2, 3, and 4 inodes refer to lower level inodes. In the preferred embodiment a sixteen bit sector number can address any file size. As each level decodes four bits, the maximum depth of the inode tree is four. Using limits of one thousand files and 16384 sectors, a table of two thousand inodes is expected to be ample for a four megabyte byte file system. The run time management system 80 uses a table for a file entry 82, a file descriptor 84, and a cache 86 as described below.

Block management: Run time information for the erasure count, the device 12–15, the file sectors 26–29 that are free, the file sectors 26–29 that are discarded, and a use state is kept about each erasure block 17–20. This information is used to determine the free space in the flash memory 10 and for sector allocation, wear leveling, and recycling physical address space in the flash memory 10 when the file sectors 26–29 that are discarded will need to be reused.

Sector allocation: This information is used to determine which file sector 26–29 is to be allocated next as a writing sector. The writing sector is allocated incrementally from one of the erasure blocks 17–20. When all the file sectors 26–29 in that erasure block 17–20 have been allocated, a new erasure block 17–20 must be selected as a writing block. The writing block and the writing sector are initialized at start up by scanning the erasure blocks 17–20 and selecting a partially allocated erasure block 17–20, or, if no partially allocated erasure block 17–20 is found, selecting the erasure block 17–20 with the lowest wear count.

Device state: In many flash memory types, access to data in the device 14 is blocked while one of the erasure blocks 17–20 in the device 14 is being erased. Erasure typically takes about one second which may be a long time to a user. Thus, most flash memory types provide erase suspend/resume operations to allow access to data segment 32 during an erasure. In the preferred embodiment, when a block erasure is initiated in the device 14, the device state is set to erasing. Before attempting to access data segment 32 in the device 14, the device state is inspected. If the device state is set to erasing, the device 14 is inspected. If the erasure is found to be complete, the device state is set to idle, otherwise a suspend erasure command is sent to the device and the device state is set to suspended. If, after the access is completed, the device state is suspended, a resume command is sent to the device 14 and the device state is set to erasing again.

Asynchronous erasure: Periodically, the flash memory is consolidated (see "consolidation") to reclaim space from file sectors 26–29 that have been discarded. Whenever the flash memory 10 is accessed the device state is checked. This allows an erasure to progress in background while accessing the device 14 by using the erase suspend/resume commands. When the erasure completes successfully the erasure block 19 is reformatted and made available. If an erasure completes with a failure, the erasure block 19 is marked as retired. Asynchronous erasures can be initiated by a function call by a flash memory 10 file access function.

Formatting: Each erasure block 17–20 is formatted by erasing it to all FF with a block erase command. The BIR 22 for each erasure block 17–20 is then set to show a valid value. This step can be optimized by using device 12–15 erase command where available. The run time management system must be re-initialized after formatting.

Initialization: Initialization happens at start up and comprises the following steps:
1) detection of devices 12–15 and selection of the appropriate flash memory control functions;
2) initialization of the data structure in temporary memory 76 to a clean state;
3) loading the temporary memory 76 with the information in the data structures in flash memory 10 (this includes scanning each file sector 26–29 in each erasure block 17–20 to build up tables for a file entry 82 (illustrated in FIG. 3) and the inode tree 81 for each file.); and
4) verifying the image of the flash memory 10 that is loaded into the temporary memory 76 is correct.

As the file sectors 26–29 are moved, the sector look-up mechanism in the case of the file data sector 27 or the file entry 82 in the case of the file header sector 28 must be updated to point to the new file sector 26–29.

Sector discard: When a file sector 26–29 is discarded, the SAT 24 of the associated erasure block 19 and statistics are updated. If all the file sectors 26–29 in the erasure block 19 are now discarded, the erasure block 19 can be erased to reclaim the space.

File open: The table for the file entry 82 is searched to find the file. Files may be opened from many handles with read only access, or by one handle with read/write access, not both. When a file is opened for writing, a new file record 40–42 should immediately be written to the temporary memory 76 to update the check sum to show that the file is open.

File close: File close performs a flush operation if the file is open for writing (see "file flush"). The file close destroys the file descriptor 84 (illustrated in FIG. 3) and adjusts a usage indicator on the file entry 82. If a file was open for writing, the flush operation must update the check sum to show that the file was closed.

File read: File reads are done on a byte basis from buffers but a sector basis from media. If the correct file sector 26–29 is not buffered, it must be loaded (see "read sector into cache"). The data segment 32 can then be accessed from the cache 86.

File write: File writes are done on a byte basis to the buffers, but on a sector basis to media. If the correct file sector 26–29 is not buffered, then it must be read into the cache 86 (illustrated in FIG. 3) The contents of this sector can then be overwritten before the sector is written back to media.

File flush: The purpose of the flush operation is to ensure that the file image on media matches what the application has written. If the cache 86 is dirty, it must be written to the media (see "write sector into cache"). A file header record 40–42 is written to reflect changes to the file (length, checksum, etc.).

Write sector from cache: If the cache 86 is not dirty, this step is skipped. The checksum value for the data in the cache 86 is calculated and the checksum in the file entry 82 is adjusted accordingly. The file sector 26–29 is written to media by allocating a new file data sector 27 and copying the data segment 32 in the cache 86 into the data sector 27. The sector lookup mechanism is updated to reflect the new sector 27. If this operation replaced an old data sector 27, the old data sector 27 is discarded using the pre-discard strategy described herein.

Read sector into cache: If the cache is dirty, it must first be written to media (see "write sector from cache"). The file sector 26–29 is located and copied from the flash memory 10 into the cache 86. If the file is open with write access, the unmodified checksum is calculated for the bytes in the cache 86 and the cache 86 is marked as clean.

File rename: To rename a file, a new file header record 40–42 is generated for the file and the old one is discarded. The file entry 82 is updated using the prediscard strategy described herein to reflect the change.

File delete: The file record 40–42 and all file data sectors 27 associated with this file are discarded.

Get free space: The free space is calculated by adding together all the free file sectors 26–29 in the block statistics and multiplying this by the size of the data segment 32 in each data sector 27 (two-hundred fifty-two in the preferred embodiment).

Find file: Files are found by applying existing matching algorithms to the table for the file entry 82.

Figure 4:
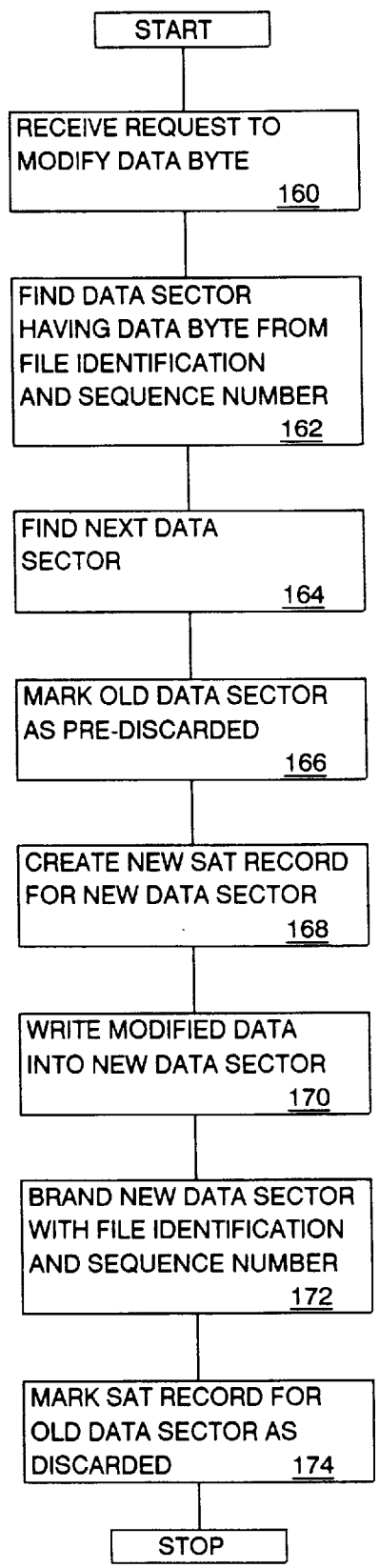
FIG. 4 is a flow chart of a method using a pre-discard indicator for preventing data from being lost while modifying the data in the flash memory of FIG. 1 using the computing machine of FIG. 2.

FIG. 4 is a flow chart of a method using the prediscard code 72 of the present invention for preventing the data segment 32 in a data file from being lost while the data segment 32 is being modified. The method is described for modifying a single data byte. Of course, a range of data bytes can be similarly modified either one by one or by taking into consideration the end addresses of the data segment 32 that are within the range. The steps of the method are carried out by the processor 62 by executing instructions in the executable code 68.

In a step 160 the processor 62 receives a request from the user for modifying a certain data byte in a data file. In a step 162 the address range of the data sector 27 including the data byte to be modified is found from information originating in the file identification 35 and the sequence number 36; and the size of the data segment 32 (two-hundred fifty-two in the preferred embodiment). In a step 164 the file sector 26–29 that should be used next is found based upon the file sector 26–29 having the next physical address space in the erasure block 17–20 that is only partially allocated to file sectors 26–29, or if all the erasure blocks 17–20 are erased or fully allocated, to the erasure block 17–20 having the lowest erasure count. In a step 166, the SAT record associated with the data sector 27 (old sector) is marked as pre-discarded in the SAT 24. In a step 168 a new SAT record is created in the SAT 24 and a new file record 40–42 is created in the file header sector 28 for the file sector 26–29 that is new. In a step 170 the modified data is written into the new data sector 26–29. In a step 172 the new file sector 26–29 is branded with the file identification 35 and the sequence number 36. In a step 174 the SAT record for the old file sector 26–29 is marked as discarded.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A computer-readable memory with a particular data structure for enabling a computer to access data from a stored data file, the memory having bits capable of being erased only in blocks, comprising:

at least one separately erasable block organized to include two or more data sectors; and each one of said data sectors for storing a data segment of said file, a file identification for identifying said file, and a sequence number for indicating a sequential position of said data segment within said file, the file identification and sequence number for enabling a computer to store, update, and subsequently read said data file without the use of a pointer to point from one said data segment to another said data segment.

2. The memory of claim 1, further including:

a pre-discard indicator controllable by said computer for indicating that a first of said data sectors is to be copied-to a second of said data sectors and a discard indicator controllable by said computer for indicating that said first data sector has been copied to said second data sector.

3. The memory of claim 1, wherein:

the erasure block is further organized to include at least one file header sector for storing at least one file record including information controllable by said computer for indicating at least one of (i) a length of said file, (ii) a checksum for said file; (iii) a date for said file.

4. The memory of claim 1, wherein:

the erasure block is further organized to include an erasure count controllable by said computer for indicating a number of times the erasure block has been erased; and a first of the erasure blocks is further organized to include a block erasure sector for storing at least one erasure record, each said erasure record controllable by said computer for indicating said erasure count corresponding to one of the erasure blocks, respectively.

5. The memory of claim 1, wherein:

the memory includes a flash memory.

6. A computing machine for storing, updating, and reading a data file, comprising:

a data memory having bits capable of being erased only in separately erasable blocks, at least one of said erasable blocks organized to include two of more data sectors, each one of said data sectors for storing a data segment of said file, a file identification for identifying said file, and a sequence number for indicating a sequential position of said data segment within said file;

a program memory having instructions for using said file identification and said sequence number for storing, updating, and reading said file; and a processor coupled to the data memory and the program memory for executing said instructions.

7. The computing machine of claim 6, wherein:

the data memory further includes a pre-discard indicator and a discard indicator corresponding to a first of said data sectors; and the program memory includes further instructions for marking said pre-discard indicator when said first data sector is to be copied to a second data sector and marking said discard indicator when said first data sector has been copied to said second data sector.

8. The computing machine of claim 6, wherein:

said erasure blocks are further organized to include at least one file header sector for storing at least one file record for indicating at least one of (i) a length of said file, (ii) a checksum for said file; (iii) a date for said file.

9. The computing machine of claim 6, wherein:

each of said erasure blocks are further organized to include an erasure count indicative of the number of times said erasure block has been erased; and a first of said erasure blocks is further organized to include a block erasure sector for storing at least one erasure record, each said erasure record controllable by said computer for indicating the erasure count corresponding to one of said erasure blocks, respectively.

10. The computing machine of claim 6, wherein:

the data memory includes a flash memory.

11. The computing machine of claim 6, further including:

a transducer/receiver for receiving data and issuing information for said data file.

12. The computing machine of claim 11, wherein:

the transducer/receiver includes a global positioning system (GPS) receiver for receiving a GPS signal and issuing said information corresponding to a geographical location.

13. A method in a computing machine for accessing a data file in a memory having bits capable of being erased only in blocks, comprising steps of:

organizing said memory into sectors;

designating one or more sectors as data sectors;

storing a data segment of said data file, a file identification for said data file, and a sequence number for a sequential position of said data segment within said data file in a first of said data sectors; and using information based upon said file identification, said sequence number, and a size of said data sectors for retrieving said data segment.

14. The method of claim 13, further including steps of:

further organizing said memory for including a pre-discard indicator associated with each one of said data sectors;

further organizing said memory for having a discard indicator associated with each one of said data sectors;

marking said pre-discard indicator when said associated one of said data sectors is to be copied; and marking said discard indicator when said associated one of said data sectors has been copied.

* * * * *